(12) United States Patent
Lee et al.

(10) Patent No.: US 9,000,572 B2
(45) Date of Patent: Apr. 7, 2015

(54) SEMICONDUCTOR PACKAGE (75) Inventors: Hoon Lee, Seongnam-si (KR); Sang-Bo Lee, Yongin-si (KR)

(73) Assignee: Samsung Electronics Co., Ltd., Samsung-ro, Yeongtong-gu, Suwon-si Gyeonggi-do (KR)

( * ) Notice: Subject to any disclaimer, the term of this patent is extended or adjusted under 35 U.S.C. 154(b) by 54 days.

(21) Appl. No.: 13/567,394

(22) Filed: Aug. 6, 2012

(65) Prior Publication Data
US 2013/0037964 A1  Feb. 14, 2013

(30) Foreign Application Priority Data

Aug. 8, 2011  (KR) .......................... 10-2011-0078410

(51) Int. Cl.
| H01L 23/02 | (2006.01) |
|---|---|
| H01L 21/00 | (2006.01) |
| H01L 23/48 | (2006.01) |
| H01L 23/00 | (2006.01) |
| H01L 25/065 | (2006.01) |
| H01L 23/31 | (2006.01) |

(52) U.S. Cl.
CPC .............. *H01L 23/481* (2013.01); *H01L 24/17* (2013.01); *H01L 25/0657* (2013.01); *H01L 2224/16225* (2013.01); *H01L 2224/17517* (2013.01); *H01L 2224/17135* (2013.01); *H01L 23/3128* (2013.01); *H01L 24/13* (2013.01); *H01L 24/16* (2013.01); *H01L 2224/16146* (2013.01); *H01L 2224/17136* (2013.01); *H01L 2924/3511* (2013.01); *H01L 2224/131* (2013.01)

(58) Field of Classification Search
CPC ............ H01L 21/563; H01L 21/67236; H01L 23/3114; H01L 23/4951; H01L 23/538; H01L 23/5389; H01L 24/01; H01L 24/10; H01L 24/18; H01L 24/82; H01L 2021/60022; H01L 2224/01; H01L 2224/08135; H01L 2224/32135; H01L 2224/82
USPC ......... 257/678–733, 774, 522, 419, 773, 758, 257/737, 499, 762, 764, 506; 438/303, 591, 438/618, 421, 584, 637, 783, 763
See application file for complete search history.

(56) References Cited

U.S. PATENT DOCUMENTS

| 6,376,914 B2* | 4/2002 | Kovats et al. ................. 257/777 |
| 2001/0003375 A1* | 6/2001 | Kovats et al. ................. 257/685 |

(Continued)

FOREIGN PATENT DOCUMENTS

| JP | 2001-176928 | 6/2001 |
| JP | 2009-158764 | 7/2009 |

(Continued)

*Primary Examiner* — Julio J Maldonado
*Assistant Examiner* — Moin Rahman
(74) *Attorney, Agent, or Firm* — Muir Patent Consulting, PLLC (57) ABSTRACT

A semiconductor package substrate may include a first semiconductor chip, a second semiconductor chip, plugs and interconnection terminals. The second semiconductor chip may be arranged on an upper surface of the first semiconductor chip. The first and second semiconductor chips may have corresponding first regions and corresponding second regions. Conductive plugs may be built only in a first region of the first semiconductor chip. Circuitry of the second semiconductor chip may only be electrically connected to the first semiconductor chip through the conductive connectors corresponding to the first regions of the first and second semiconductor chips.

14 Claims, 4 Drawing Sheets

(56) References Cited

U.S. PATENT DOCUMENTS

| | | |
|---|---|---|
| 2001/0004135 A1 | 6/2001 | Okamura |
| 2010/0044847 A1* | 2/2010 | Lee ............................... 257/686 |
| 2010/0081236 A1 | 4/2010 | Yang et al. |
| 2010/0096760 A1 | 4/2010 | Yu et al. |
| 2010/0102428 A1* | 4/2010 | Lee et al. ....................... 257/686 |
| 2011/0089575 A1* | 4/2011 | Lee ............................... 257/777 |
| 2011/0108982 A1* | 5/2011 | Kim et al. ..................... 257/737 |

FOREIGN PATENT DOCUMENTS

| | | |
|---|---|---|
| KR | 10-2010-0037300 | 4/2010 |
| KR | 10-2010-0044100 | 4/2010 |

* cited by examiner

SEMICONDUCTOR PACKAGE

CROSS-RELATED APPLICATION

This application claims priority under 35 USC §119 to Korean Patent Application No. 10-2011-0078410, filed on Aug. 8, 2011 in the Korean Intellectual Property Office (KIPO), the contents of which are herein incorporated by reference in their entirety.

BACKGROUND

Example embodiments relate to a semiconductor package. More particularly, example embodiments relate to a semiconductor package including a plug.

SUMMARY

Example embodiments provide a semiconductor package substrate having improved electrical connection reliability between an interconnection terminal and a plug.

According to some example embodiments, there is provided a semiconductor package.

In one embodiment, a semiconductor package comprises a package substrate; a first semiconductor chip stacked on the package substrate, the first semiconductor chip including a first region and at second region; at least a second formed semiconductor chip stacked on the first semiconductor chip, the second semiconductor chip including a first region and at second region; a first plurality of conductive plugs disposed in the first region of the first semiconductor chip; and a first plurality of conductive connectors disposed between the first plurality of conductive plugs and the second semiconductor chip to electrically connect the first semiconductor chip with circuitry of the second semiconductor chip, wherein the first region of the first semiconductor chip corresponds to a respective first region of the second semiconductor chip and the second region of the first semiconductor chip corresponds to a respective second region of the second semiconductor chip, and wherein circuitry of the second region of the second semiconductor chip is electrically connected to the first semiconductor chip only through conductive connectors corresponding to the first region of the first semiconductor chip and the first region of the second semiconductor chip.

In one embodiment, a semiconductor package comprises a package substrate; a first semiconductor chip stacked on the package substrate, the first semiconductor including a first region and a second region; at least a second semiconductor chip stacked on the first semiconductor chip, the second semiconductor chip including a first region and a second region; a first plurality of conductive vias disposed in the first region of the first semiconductor chip to electrically connect the first semiconductor chip with circuitry of the second semiconductor chip; and a first plurality of dummy vias disposed in the second region of the first semiconductor chip, wherein the first semiconductor chip is not electrically connected to circuitry in the second semiconductor chip via the first plurality of dummy vias.

A semiconductor package comprises a first semiconductor chip; at least a first interposer chip stacked on the first semiconductor chip, the first interposer chip including a first region and a second region; at least a second semiconductor chip stacked on the first interposer chip, the second semiconductor chip including a first region and a second region; a plurality of interposer vias, each interposer via having an upper end at an upper surface of the first region of the first interposer chip and a lower end extending from the upper end and being electrically connected with the first semiconductor chip; and a plurality of conductive connectors disposed only between the respective upper ends of the plurality of interposer vias and a plurality of terminals disposed only in first regions of the second semiconductor chip, wherein the first region of the first interposer chip corresponds to the first region of the second semiconductor chip and the second region of the first interposer chip corresponds to the second region of the second semiconductor chip, and wherein circuitry of the second region of the second semiconductor chip is not in logical communication with the first semiconductor chip through any conductive connectors corresponding to the second region of the first interposer.

BRIEF DESCRIPTION OF THE DRAWINGS

The above and other aspects and features of the disclosure will become apparent by describing in detail exemplary embodiments thereof with reference to the attached drawings, in which.

DETAILED DESCRIPTION OF THE EMBODIMENTS

Various example embodiments will be described more fully hereinafter with reference to the accompanying drawings, in which some example embodiments are shown. The present invention may, however, be embodied in many different forms and should not be construed as limited to the example embodiments set forth herein. That is, these example embodiments are just that—examples—and many implementations and variations are possible that do not require the various details herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity. Like numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between;" "adjacent" versus "directly adjacent," etc.). As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless otherwise indicated, these terms are only used to distinguish one element, component, region, layer or section from another region, layer or section. Thus, a first element, component, region, layer or section discussed below could be termed a second element, component, region, layer or section, and, similarly, a second element, component, region, layer or section could be termed a first element, component, region, layer or section without departing from the teachings of the disclosure.

Locational terms, such as "beneath," "below," "lower," "above," "upper" and the like, may be used herein for ease of description to describe one element or feature's relationship to another element(s) or feature(s) as illustrated in the figures. It will be understood that the locational terms may be relative to a device and are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the locational descriptors used herein interpreted accordingly.

The terminology used herein is for the purpose of describing particular example embodiments only and is not intended to be limiting of the present invention. As used herein, the singular forms "a," "an" and "the" should not exclude the plural forms as well, unless the context clearly indicates otherwise. It will be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures) of example embodiments. As such, variations from the shapes of the illustrations as a result, for example, of manufacturing techniques and/or tolerances, are to be expected. Example embodiments should not be construed as limited to those shown in the views, but include modifications in configuration formed on the basis of, for example, manufacturing processes. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures may be schematic in nature and are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application and will not be interpreted in an idealized or overly formal sense unless expressly so defined herein.

Hereinafter, example embodiments will be explained in detail with reference to the accompanying drawings.

Generally, a plurality of semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages.

In order to increase a storage capacity of the semiconductor package, a multi-chip package including a plurality of semiconductor chips sequentially stacked may be used. An electrical medium such as a conductive wire, a conductive bump, a plug, etc., may be used for electrically connecting the stacked semiconductor chips with each other. For example, a plug may be built in a lower semiconductor chip. The plug may be electrically connected with an upper semiconductor chip. The plug may also be electrically connected with a package substrate. After forming the plug, a lower surface of the lower semiconductor chip (e.g., a lower surface of a lower semiconductor substrate in the lower semiconductor chip) may be partially removed to expose the plug. In some embodiments, the plug is a through-via. For example, the plug may be a through-silicon via or any other type of conductive through-via.

In some embodiments, a package may be built with an upper stacked semiconductor chip formed and then stacked on a package that has a lower stacked semiconductor chip already disposed thereon. A semiconductor substrate of the upper stacked chip may have a very thin thickness due to the removal of a lower surface of the semiconductor substrate during processing. Due to the processing of the upper semiconductor chip, a bending may be generated in the thin semiconductor substrate. For example, the semiconductor substrate may be bent upwardly or downwardly. When the semiconductor substrate is bent downwardly (e.g., concave with respect to a top of the package), an edge portion of the semiconductor substrate may be positioned higher than a central portion of the semiconductor substrate. When the semiconductor substrate is bent upwardly (e.g., convex with respect to a top of the package), the central portion of the semiconductor substrate may be positioned higher (e.g., closer to a top of the package) than the edge portion of the semiconductor substrate. In some examples, the bending of the semiconductor substrate may not be uniform or towards a certain region of the chip, but may instead be random, with some parts of the chip bent upwards and other parts bent downwards. The bent semiconductor substrate may have one or more high-positioned regions and/or one or more low-positioned regions with respect to the average height or vertical distance to the center of the chip.

An interconnection terminal of the upper semiconductor chip connected to a high-positioned region of the chip may be slightly moved upwardly, so that the interconnection terminal in the high-positioned region may not accurately make contact with the plug in the lower semiconductor chip. As a result, electrical connection reliability between the interconnection terminal and the plug (and, correspondingly, the upper and lower semiconductor chips) may be deteriorated. Similar issues may exist when stacking a formed first semiconductor chip on a package substrate and when stacking one or more formed semiconductor chips on the second semiconductor chip.

In other embodiments, the upper semiconductor chip may have been tested and found to have certain areas (i.e. "dead zones") of the chip that do not function properly or would otherwise not be used to process or input/output electrical signals. As a result, electrical connection reliability between these dead zones of the upper lower semiconductor chip and the lower semiconductor chip may be deteriorated or nonexistent. In some embodiments, pads may not be formed in the dead zones of semiconductor chips, thus reducing the possibility of electrically communicating with circuitry connected to pads in the dead zones. In some embodiments, the dead zone may encompass those portions of a semiconductor chip that are bent or warped as discussed above.

Figure 1:
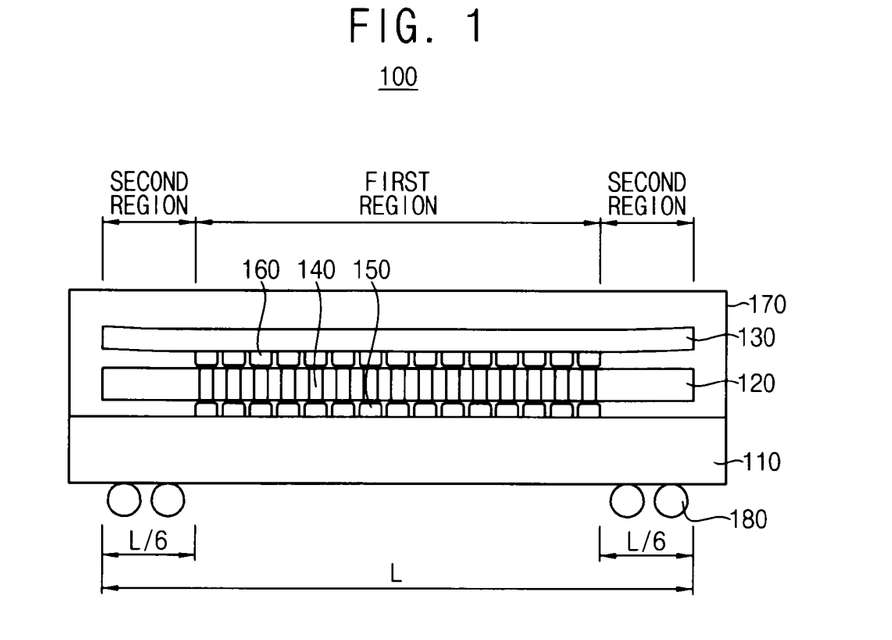
FIG. 1 is a cross-sectional view illustrating a semiconductor package in accordance with example embodiments.

FIG. 1 is a cross-sectional view illustrating a semiconductor package in accordance with example embodiments.

Referring to FIG. 1, an exemplary semiconductor package 100 may include a package substrate 110, a first semiconductor chip 120, a second semiconductor chip 130, one or more plugs 140, one or more first interconnection terminals 150, one or more second interconnection terminals 160, a molding member 170 and one or more external terminals 180.

The package substrate 110 may include an insulating substrate (not shown) and a circuit pattern (not shown) built in the insulating substrate. The circuit pattern may have an upper end exposed through an upper surface of the insulating substrate, and a lower end exposed through a lower surface of the insulating substrate.

The first semiconductor chip 120 may be stacked on an upper surface of the package substrate 110. The first semiconductor chip 120 may have been formed and then stacked on the upper surface of the package substrate 110. In other embodiments, the package substrate 110 and the first semiconductor chip 120 may have been manufactured in a single process. The second semiconductor chip 130 may be stacked on an upper surface of the first semiconductor chip 120. The plugs 140 may be built vertically in the first semiconductor chip 120. Each of the plugs 140 may have an upper end exposed at the upper surface of the first semiconductor chip 120, and a lower end exposed at a lower surface of the first semiconductor chip 120. The plugs 140 may be through-substrate vias including through electrodes made of, for example, metal or other conductive materials. The plugs 140 may be made of any conductive material used in semiconductor manufacturing. The plugs 140 may have a first type. For example, they may be plugs electrically connected to circuitry in the second semiconductor chip 130. In some embodiments, the plugs 140 may be regularly spaced apart. The pitch length between each of the plugs 140 may be identical. In some embodiments, the pitch length between the plugs 140 may be less than 200 micrometers.

The first interconnection terminals 150 may be interposed between the package substrate 110 and the first semiconductor chip 120 to electrically connect the package substrate 110 and the first semiconductor chip 120 with each other. In some embodiments, the first interconnection terminals 150 may connect to and make contact with lower ends of the plugs 140 exposed at the lower surface of the first semiconductor chip 120. The first interconnection terminals 150 may also make contact with the circuit pattern of the package substrate 110. The first interconnection terminals 150 may be solder balls, bonding wires, conductive bumps, conductive spacers, pin grid arrays (PGAs), or the like. The first interconnection terminals 150 may be the same size or may have different sizes. The first interconnection terminals 150 may be electrically connected to the circuitry of the first semiconductor chip 120 and may be for communicating signals between the first semiconductor chip 120 and an external device (e.g. an external host or controller).

The second interconnection terminals 160 may be interposed between the first semiconductor chip 120 and the second semiconductor chip 130 to electrically connect the first semiconductor chip 120 and the second semiconductor chip 130 with each other. In some embodiments, the second interconnection terminals 160 may make contact with the upper ends of the plugs 140 exposed at the upper surface of the first semiconductor chip 120. The second interconnection terminals 160 may be solder balls, bonding wires, conductive bumps, conductive spacers, pin grid arrays (PGAs), or the like. The second interconnection terminals 160 may be the same size or may have different sizes from each other. The second interconnection terminals 160 may be of a first type, and as such may be electrically connected to the circuitry of the first semiconductor chip 120 and the circuitry of the second semiconductor chip 130 and may be for communicating signals and/or power between the first semiconductor chip 120 and the second semiconductor chip 130. In one embodiment, though not shown, interconnection terminals 150 and/or 160 may not be used, and a plug 140 that extends past a surface of first semiconductor chip 120 may be used instead of interconnection terminals 150 and/or 160.

In example embodiments, the second semiconductor chip 130 may have one or more bent or warped portions that may be generated by partially removing a surface (e.g., a lower surface) of the second semiconductor chip 130 during manufacturing. In some embodiments, a warped region may contain one or more portions of the chip that have a slope of more than plus or minus 15 degrees compared to the slope of the outer surface of the chip in a non-warped region.

In some embodiments, an outer surface of a substrate of a non-warped region of a first semiconductor chip may be within an acceptable range of distance from an outer surface of the package substrate in a parallel direction on which the first semiconductor chip is stacked and/or from a second semiconductor chip stacked adjacent to the first semiconductor chip. For example, an outer surface of a non-warped region of the first semiconductor chip may include portions of the first semiconductor chip substrate that are within a first distance or first range of distances from an outer surface of the package substrate or the adjacent second semiconductor chip, and an outer surface of the warped region of the first semiconductor chip may include portions that are outside that first distance of first range of distances from an outer surface of the package substrate and/or the second stacked semiconductor chip.

In some embodiments, a bottom surface of a non-warped portion of a second semiconductor chip 130 may be substantially parallel with a top surface of the first semiconductor chip 120, while a bottom surface of a warped portion of the second semiconductor chip 130 may not be substantially parallel with the top surface of the first semiconductor chip 120. In other embodiments, the second semiconductor chip 130 may have a central portion that is warped, while the edge portions of the second semiconductor chip 130 may be unwarped and may be substantially parallel with the upper surface of the first semiconductor chip 120. In some embodiments, the warping of the second semiconductor chip 130 may be gradual and an unevenness of a bottom surface of the second semiconductor chip 130 may extend from a non-warped region of the second semiconductor chip 130 to a warped region of the second semiconductor chip 130.

In some embodiments, the semiconductor chip have one or more regions, for example, one or more first type regions (first regions) and one or more second type regions (second regions). The semiconductor chip may have been tested and may include second regions that do not function properly or would otherwise not be used to process or input/output electrical signals. As a result, electrical connection reliability between the second regions of the upper semiconductor chip and the lower semiconductor chip may be deteriorated or non-existent. In these embodiments, circuitry of the second regions may not be electrically connected to terminals or any other type of connector disposed at a bottom or top surface of the chip at the second regions to electrically connect or enable logical communication with other chips and/or substrates. In an embodiment where the semiconductor chip is an upper chip is stacked on a lower semiconductor chip, the circuitry of the upper chip at the second regions may not be electrically connected to the lower semiconductor chip by any terminals or connectors disposed at a bottom surface of the upper chip, where the bottom surface is the surface of the upper chip closest to the lower semiconductor chip.

In some embodiments, plugs and pads are formed only in first regions of a semiconductor chip. In some embodiments, the pitch between the plugs formed in the first regions of a semiconductor chip may be identical. In some embodiments, plugs and pads may be formed in first regions of a first semiconductor chip to be stacked with a second semiconductor chip, where the first regions of the first semiconductor chip correspond to one or more first regions of the second semiconductor chip that are electrically connection to the first semiconductor chip using plugs and/or pads. In some embodiments, plugs and pads may not be formed in second regions of a first semiconductor chip to be stacked with a second semiconductor chip. In some embodiments, the semiconductor chip has terminals disposed thereon only in first regions of the chip. In some embodiments, the semiconductor chip has circuitry connected to terminals and/or pads disposed in an outer surface of first regions, but does not have any circuitry connected to terminals and/or pads disposed in an outer surface of a second region. In some embodiments, pads or connectors disposed at an outer surface of a second region of the semiconductor chip are electrically isolated from circuitry in the semiconductor chip. In these embodiments, pads or connectors disposed at outer surface of first regions of the semiconductor chip may be electrically connected to circuitry in the semiconductor chip.

In some embodiments, the second region may encompass a portion of the semiconductor chip of 2-5 pitch lengths and may extend from the edge of the chip to the center of the chip in a horizontal direction. In some embodiments, the second regions may encompass 5-25 pitch lengths and may extend the edge of the chip to the center of the chip in a horizontal direction. In some embodiments, the second regions may be in the center of the chip (in a horizontal direction) and may encompass a length of 2-5 pitch lengths. In some embodiments, the second regions may be in the center of the chip (in a horizontal direction) and may encompass a length of 5-25 pitch lengths. In some embodiments, the second regions may extend from an edge of the chip to the center of the chip in a horizontal direction and may have a horizontal length of ⅙ the length of the semiconductor chip. In some embodiments, the second regions may have a horizontal length of at least ⅙ of the semiconductor chip. In some embodiments, the second regions may encompass those portions of a semiconductor chip that are bent or warped as discussed above and first regions may encompass those portions of a semiconductor chip that are not bent nor warped.

In example embodiments, a first region of the second semiconductor chip 130 may include a portion of the first semiconductor chip 120 that is non-warped, non-bent, electrically connected, etc. A second region of the second semiconductor chip 130 may include a portion of the second semiconductor chip 130 that is warped, bent, electrically disconnected, etc. Correspondingly, a portion of the first semiconductor chip 120 under the first region of the second semiconductor chip 130 may be referred to as the first region. A portion of the first semiconductor chip 120 under the second region of the second semiconductor chip 130 may be referred to as the second region. There may be more than one first region and more than one second region in each of the first and second semiconductor chips 120, 130.

In FIG. 1, the second semiconductor chip 130 is shown as having second regions on the edges of the chip 130, as shown by the delineation of the edges as the second region and the center of the chip as the first region. In some embodiments, and as shown in FIG. 1, the plugs 140 may be arranged only in the first region of the first semiconductor chip 120 and may not be arranged in the second region of the first semiconductor chip 120. The second interconnection terminals 160 may also be arranged only in the first region and may not be arranged in the second region. In these embodiments, an empty space may be formed between the first semiconductor chip 120 and the second semiconductor chip 130 in the second region. The contacts between the plugs 140 and the second interconnection terminals 160 may exist only in the first region and may not exist in the second region. By not providing electrical contacts between the first semiconductor chip 120 and the second semiconductor chip 130 in the second regions of the second semiconductor chip 130, incomplete contacts between the plugs 140 and the second interconnection terminals 160 in the second region may be completely prevented.

In some embodiments, the second region in a lateral direction of the second semiconductor chip 130 may have a length of at least ⅙ the length of the second semiconductor chip 130. The length of the second region may correspond to a statistical result obtained from positions where the incomplete contacts between the plugs 140 and the second interconnection terminals 160 may be generated due to the bending or warping of the second semiconductor chip 130. The length of the second region may vary as well and may not be necessarily about ⅙ times the length of the second semiconductor chip 130. In some embodiments, the bending of the second semiconductor chip 130 may vary in accordance with a thickness of the second semiconductor chip 130, meaning that the length of the second region may also vary in accordance with the thickness of the second semiconductor chip 130. In some embodiments, the length of the second region may be 2-5 times the pitch length between the plugs 140. In some embodiments, the length of the second region may be between 5-10 times the pitch length between the plugs 140. In some embodiments, the pitch length between the plugs 140 may be less than 200 micrometers.

The molding member 170 may be formed on the upper surface of the package substrate 110 to cover the first semiconductor chip 120 and the second semiconductor chip 130. The molding member 170 may protect the first semiconductor chip 120 and the second semiconductor chip 130 from external environments. In example embodiments, the molding member 170 may include an epoxy molding compound (EMC) but is not limited thereto.

The external terminals 180 may be mounted on the lower surface of the package substrate 110. The external terminals 180 may make contact with and electrically connect to the circuit pattern exposed at a lower surface of the package substrate 110. In example embodiments, the external terminals 180 may include solder balls, bonding wires, conductive bumps, conductive spacers, pin grid arrays (PGAs), or the like, and may be electrically connected to the circuitry of the first and second semiconductor chips 120, 130 and may be used for communicating signals and/or power between the first and/or second semiconductor chips 120, 130 and an external device (e.g. an external host or controller).

According to this example embodiment, the plugs and the interconnection terminals may not exist in the second region, so that electrical contacts between the plugs and the outer surface of the second semiconductor chip 130 (or any interconnection terminals disposed thereon) in the second region may be completely prevented. As a result, the semiconductor package may have improved electrical connection reliability.

Figure 2:
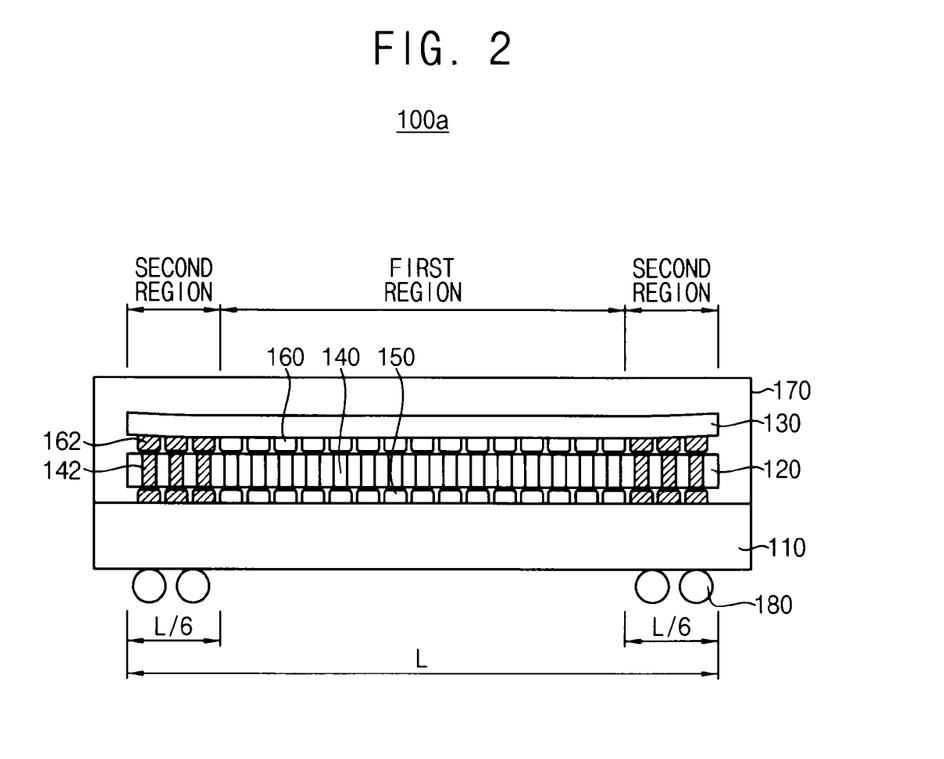
FIG. 2 is a cross-sectional view illustrating a semiconductor package in accordance with example embodiments.

FIG. 2 is a cross-sectional view illustrating a semiconductor package in accordance with example embodiments.

An exemplary semiconductor package 100a may include elements substantially the same as those of the semiconductor package 100 in FIG. 1. Thus, the same reference numerals may refer to the same elements, and any further illustrations with respect to the same elements may be omitted herein for brevity.

Referring to FIG. 2, the semiconductor package 100a of this example embodiment may further include the dummy plugs 142 and the dummy terminals 162.

The dummy plugs 142 and the dummy terminals 162 may be arranged in the one or more second regions. The dummy plugs 142 and dummy terminals 162 may have the same structure as the plugs 140 and the terminals 160, but may be non-functional. In some embodiments, the dummy plugs 142 and dummy terminals 162 may be non-conductive. The dummy plugs 142 and the dummy terminals 162 may not be electrically connected to the circuitry on the first semiconductor chip 120 and/or the second semiconductor chip 130. In one embodiment, electrical signals do not pass through the dummy plugs 142 or the dummy terminals 162, so that an electrical connection between the dummy plugs 142 and corresponding dummy terminals 162 in the second region may have no relationship to operations of the semiconductor package 100a. In some embodiments, the semiconductor package 100a includes plugs and terminals that may be capable of transmitting electrical signals and/or power between the first semiconductor chip 120 and the second semiconductor chip 130, but that may not be used by the first and second semiconductor chips 120, 130 because they are disposed in the second region.

In example embodiments, the dummy plugs 142 and the dummy terminals 162 in the empty space of the second region may physically support the second region(s) of the second semiconductor chip 130. Thus, the dummy plugs 142 and the dummy terminals 162 may prevent the second semiconductor chip 130 from being further damaged due to pressure to the upper surface of the second semiconductor chip 130.

Figure 3:
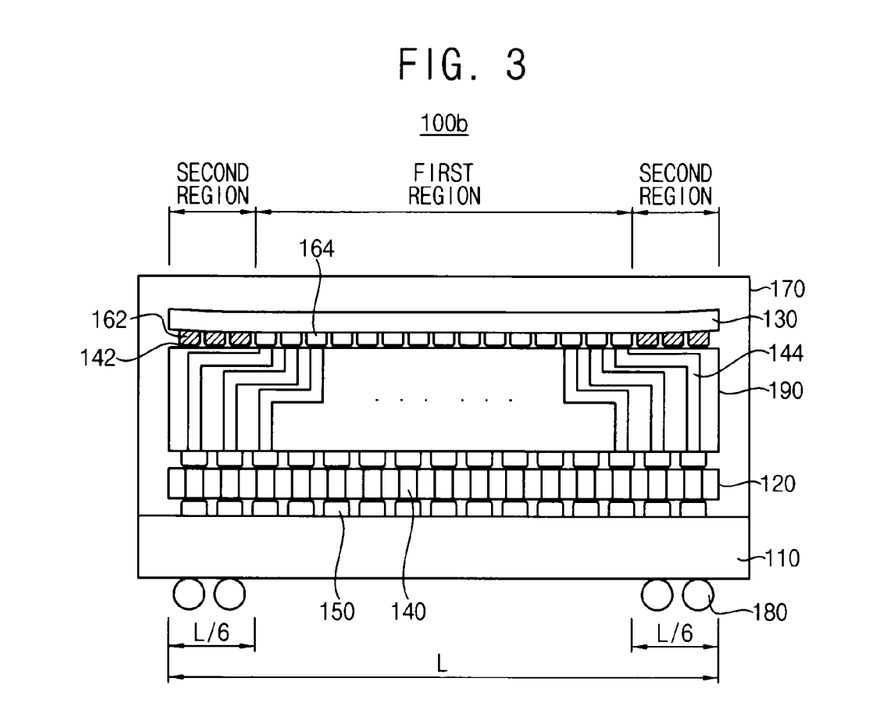
FIG. 3 is a cross-sectional view illustrating a semiconductor package in accordance with example embodiments.

FIG. 3 is a cross-sectional view illustrating a semiconductor package 100b in accordance with example embodiments.

An exemplary semiconductor package 100b may include elements substantially the same as those of the semiconductor package 100a in FIG. 2. Thus, the same reference numerals may refer to the same elements, and any further illustrations with respect to the same elements may be omitted herein for brevity.

Referring to FIG. 3, the semiconductor package 100b of this example embodiment may further include an interposer chip 190. The interposer chip 190 may be interposed between the first semiconductor chip 120 and the second semiconductor chip 130. The use of an interposer chip 190 may prevent the need to reroute or adjust the electrical connections and/or signals of the first semiconductor chip 120 and/or the need to re-design the first semiconductor chip 120.

The interposer plugs 144 may be vias that pass through the interposer chip 190 and may, at least in part, be vertically disposed in the interposer chip 190. The interposer terminals 164 may be interposed between the interposer plugs 144 and the second semiconductor chip 130. The interposer plugs 144 may be similar to or the same as the plugs 140, for example, by having similar materials. The interposer terminals 164 may be similar to or the same as the first interconnection terminals 150, for example, by having a similar shape or size and/or by being made of a similar material.

In example embodiments, each of the interposer plugs 144 may have an upper end exposed at an upper surface of the interposer chip 190, and a lower end exposed at a lower surface of the interposer chip 190. The upper ends of the interposer plugs 144 may be positioned only in the first region (s). The lower ends of the interposer plugs 144 may be positioned in the first region and the second region. In some embodiments, the lower ends of the interposer plugs 144 may be uniformly arranged on the lower surface of the interposer chip 190. The lower ends of the interposer plugs 144 may be disposed at the lower surface of the interposer chip 190 in the same manner as the plugs 140 of the first semiconductor chip 120.

In some embodiments, because the lower ends of the interposer plugs 144 may be uniformly arranged in the first region and the second region, the plugs 140 in the first semiconductor chip 120 and the first interconnection terminals 150 between the first semiconductor chip 120 and the package substrate 110 may be uniformly arranged in the first region and the second region in accordance with the arrangement of the lower ends of the interposer plugs 144.

In example embodiments, a re-design of the first semiconductor chip 120 may not be needed due to the use of the interposer chip 190 and the interposer plugs 144. The semiconductor package 100a in FIG. 2 may involve the re-design of the first semiconductor chip 120 so as to reroute the electrical signals of the first semiconductor chip 120 through only the plugs 140 in the first region(s) of the first semiconductor chip 120. The semiconductor package 100b may not require the re-design of the first semiconductor chip 120 and the plugs 140 may be uniformly or otherwise normally disposed in the first semiconductor chip 120.

In some embodiments, the semiconductor package 100b may include dummy plugs 142 and dummy terminals 162 or the semiconductor package 100b may not include the dummy plugs 142 and the dummy terminals 162.

The semiconductor package 100b may have improved electrical connection reliability without the re-design of the first semiconductor chip 120 due to the use of the interposer chip 190 and the interposer plugs 144.

Figure 4:
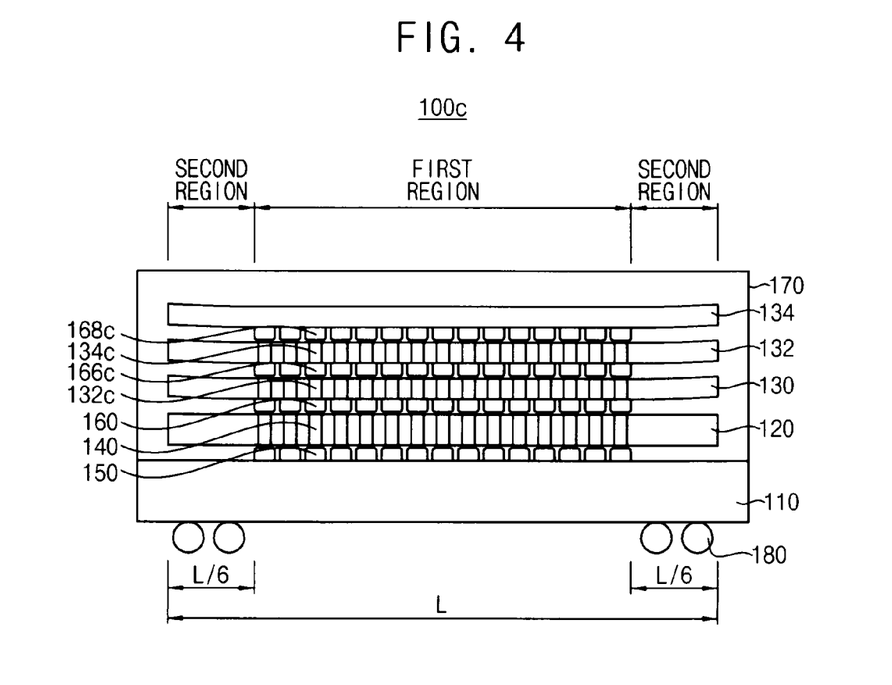
FIG. 4 is a cross-sectional view illustrating a semiconductor package in accordance with example embodiments.

FIG. 4 is a cross-sectional view illustrating a semiconductor package in accordance with example embodiments.

Exemplary semiconductor package 100c may include elements substantially the same as those of the semiconductor package 100 in FIG. 1. Thus, the same reference numerals may refer to the same elements, and any further illustrations with respect to the same elements may be omitted herein for brevity.

Referring to FIG. 4, the semiconductor package 100c may further include a third semiconductor chip 132 and a fourth semiconductor chip 134. The third semiconductor chip 132 may be stacked on the second semiconductor chip 130. The fourth semiconductor chip 134 may be stacked on the third semiconductor chip 132. The third semiconductor chip 132 and the fourth semiconductor chip 134 may have first and second regions substantially similar to the first and second regions of the second semiconductor chip 130.

The first and second regions of the first, second, third, and fourth semiconductor chips 120, 130, 132, and 134 may or may not correspond in part or in whole with each other. In some embodiments, the third semiconductor chip 132 and the fourth semiconductor chip 134 may have first regions and second regions corresponding to the first region and the second region of the second semiconductor chip 130, respectively. In some embodiments, the first regions of the third semiconductor chip 132 may only correspond to the first regions of the fourth semiconductor chip 134. The first regions of the fourth semiconductor chip 134 may correspond only to the first regions of the second semiconductor chip 130. In other embodiments, the first regions of the second semiconductor chip 130 may or may not correspond or match up with the first regions of the third semiconductor chip 132 and the fourth semiconductor chip 134. In some embodiments, the first regions of the second semiconductor chip 130, the third semiconductor chip 132 and the fourth semiconductor chip 134 may not correspond at all or may not correspond completely. The plugs and interconnection terminals used to electrically connect the first, second, third, and fourth semiconductor chips 120, 130, 132, and 134 may vary in their disposition on the surfaces of those chips 120, 130, 132, and 134 according to the placement of the first regions of the surfaces.

As shown in FIG. 4, second plugs 132c may be built in the first region of the second semiconductor chip 130 and third plugs 134c may be built in the first region of the third semiconductor chip 132. The second plugs 132c and the third plugs 134c may be electrically connected with each other via third interconnection terminals 166c. The third plugs 134c may be electrically connected to the fourth semiconductor chip 134 via fourth interconnection terminals 168c.

In example embodiments, the semiconductor package 100c may include the four semiconductors chip 120, 130, 132 and 134. The number of chips in the semiconductor package 100c is not limited to the examples described herein. For example, the semiconductor package 100c may include at least five semiconductor chips or may include three semiconductor chips.

In some embodiments, the semiconductor package 100c may further include dummy plugs 142 and dummy terminals 162 in the second regions of one or more of the semiconductor chips 120, 130, 132, and 134. In some embodiments, the semiconductor package 100c may further include one or more interposer chips 190 disposed between the first and second semiconductor chips 120, 130, between the second and third semiconductor chips 130, 132, and/or between the third and fourth semiconductor chips 132, 134.

FIGS. 5-8 show cross-sectional views illustrating exemplary semiconductor packages in accordance with example embodiments.

Figure 5:
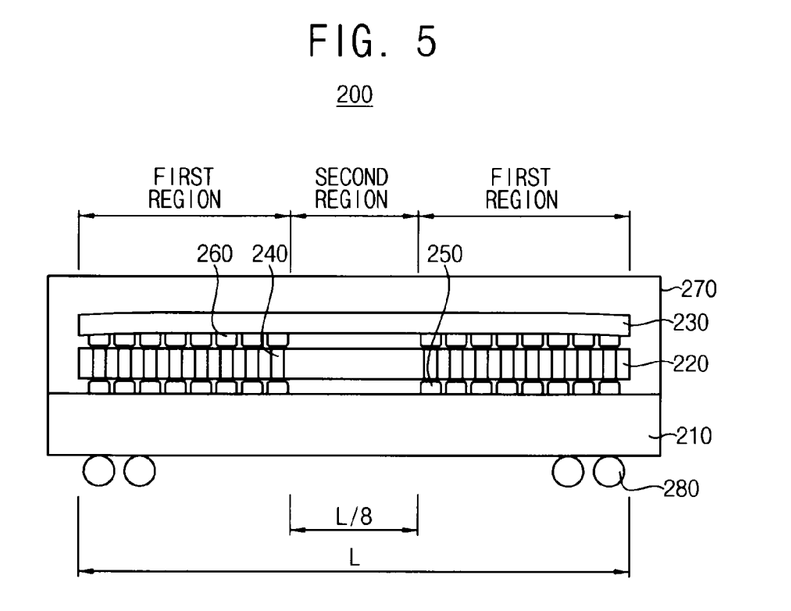
FIG. 5 is a cross-sectional view illustrating a semiconductor package in accordance with example embodiments.

Referring to FIG. 5, a semiconductor package 200 is similar to the semiconductor package 100. The semiconductor package 200 may include a package substrate 210, a first semiconductor chip 220, a second semiconductor chip 230, plugs 240, first interconnection terminals 250, second interconnection terminals 260, a molding member 270 and external terminals 280. In semiconductor package 200, the second region of the second semiconductor chip 230 is disposed in the center of the semiconductor chips and the first regions surround the second region.

The embodiments and features of the semiconductor package 100 may be equally applicable to the semiconductor package 200. Further, in some embodiments, the second region may have a length of at least ⅛ times a length of the second semiconductor chip 230. The length of the second region may also vary in accordance with the thickness of the second semiconductor chip 230. Like semiconductor package 100, the semiconductor package 200 may have improved electrical connection reliability.

Figure 6:
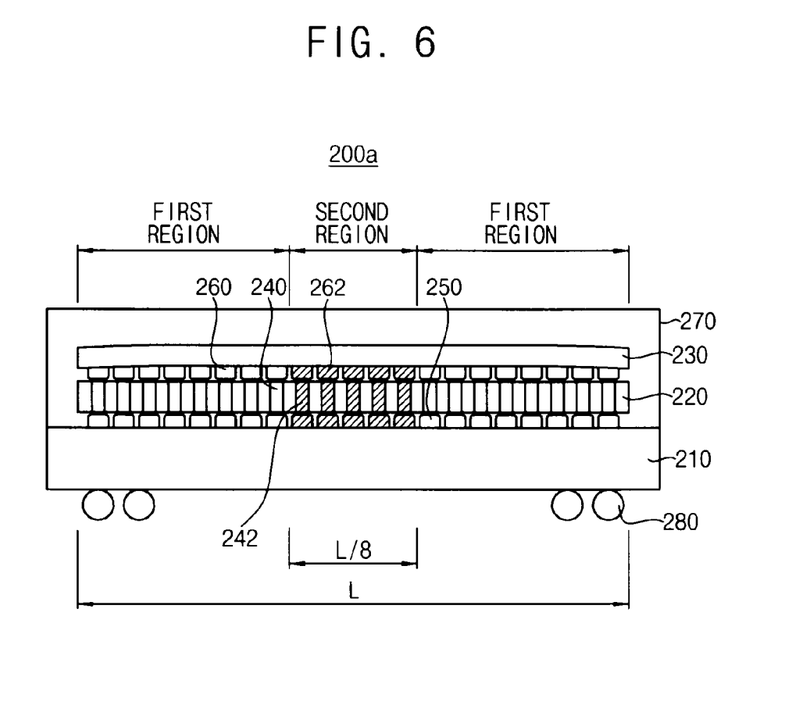
FIG. 6 is a cross-sectional view illustrating a semiconductor package in accordance with example embodiments.

FIG. 6 is a cross-sectional view illustrating a semiconductor package in accordance with example embodiments.

A semiconductor package 200a may correspond to semiconductor package 100a except for the placement of the first and second regions. Semiconductor package 200a has first and second regions that correspond with the first and second regions of semiconductor package 200. The embodiments and features of the semiconductor package 200a may be equally applicable to the semiconductor package 100a. For example, the semiconductor package 200a may further include the dummy plugs 242 and the dummy terminals 262.

Figure 7:
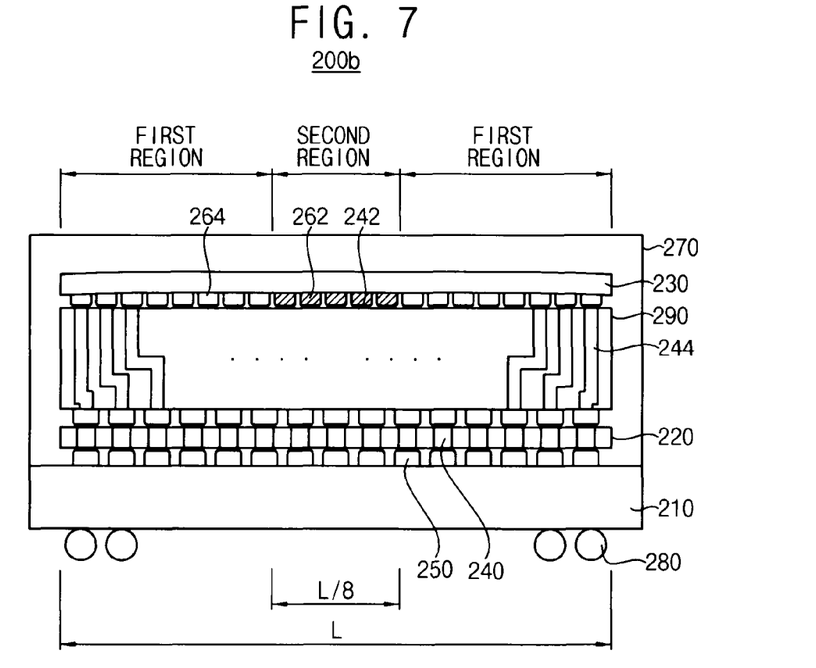
FIG. 7 is a cross-sectional view illustrating a semiconductor package in accordance with example embodiments.

FIG. 7 is a cross-sectional view illustrating a semiconductor package in accordance with example embodiments.

A semiconductor package 200b may correspond substantially with the semiconductor package 100b except for the location of the first and second regions. Semiconductor package 200b has first and second regions that correspond with the first and second regions of semiconductor package 200. The embodiments and features of the semiconductor package 200b may be equally applicable to the semiconductor package 100b. For example, the semiconductor package 200b may further include the interposer chip 290. The semiconductor package 200b may have improved electrical connection reliability without the re-design of the first semiconductor chip due to the interposer chip and the interposer plugs.

Figure 8:
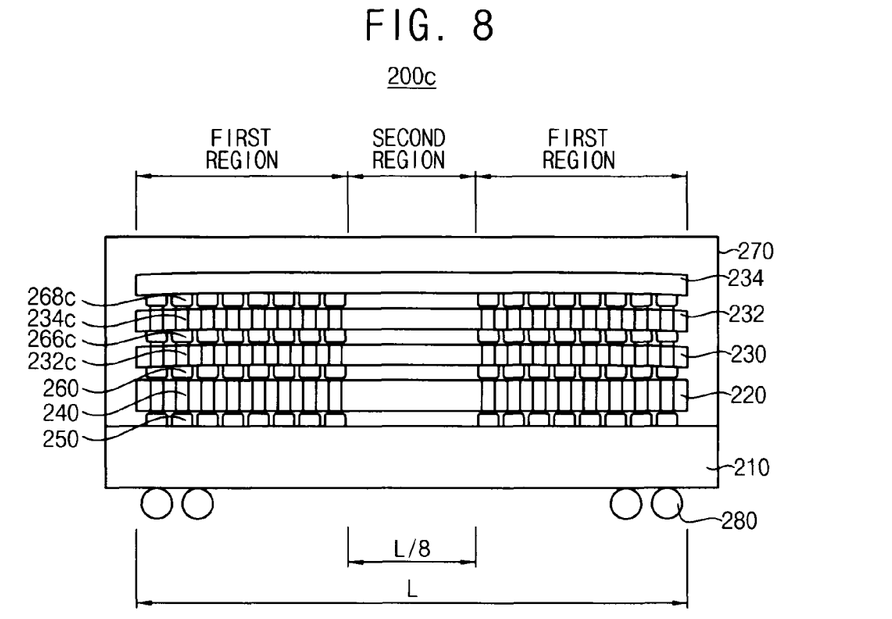
FIG. 8 is a cross-sectional view illustrating a semiconductor package in accordance with example embodiments.

FIG. 8 is a cross-sectional view illustrating a semiconductor package in accordance with example embodiments.

A semiconductor package 200c may correspond substantially with the semiconductor package 100c except for the location of the first and second regions. Semiconductor package 200c has first and second regions that correspond with the first and second regions of semiconductor package 200. The embodiments and features of the semiconductor package 200c may be equally applicable to the semiconductor package 100c. For example, the semiconductor package 200c may further include the third semiconductor chip 232 and the fourth semiconductor chip 234.

In some embodiments, the first semiconductor chip may be formed and then stacked on the semiconductor substrate with issues similar to those discussed above with the second semiconductor chip. In these embodiments, the electrical connections between the package substrate and the first semiconductor chip may be similar to those discussed above between the first semiconductor chip and the second semiconductor chip. For example, dummy terminals may be used between the package substrate and the first semiconductor chip. In another example, an interposer chip may be stacked between the package substrate and the first semiconductor chip.

In some embodiments, a controller may be used to determine the first and second regions of the semiconductor chips in a package. For example, known techniques of thinning a semiconductor substrate may result in predictable bendings or warpings of a semiconductor chip, making the automated control and/or fabrication of packages with warped or bent semiconductor chips possible. In other embodiments, the electrical connections may be determined manually and may still be predictable or may have to be determined on a case-by-case basis. In other embodiments, the packages and electrical connections are designed based on known properties of the semiconductor chips and/or package substrate. In some embodiments, different sizes of interconnection terminals (or the like) may be used based upon the bending or warping of the semiconductor chip to be stacked on the package.

The above-disclosed subject matter is to be considered illustrative and not restrictive, and the appended claims are intended to cover all such modifications, enhancements, and other embodiments, which fall within the true spirit and scope of the disclosed embodiments. Thus, the invention is to be construed by the broadest permissible interpretation of the following claims and their equivalents, and shall not be restricted or limited by the foregoing detailed description.

What is claimed is:

1. A semiconductor package comprising:
a package substrate;
a first semiconductor chip stacked on the package substrate, the first semiconductor chip including a first region and a second region and having a top surface and bottom surface;
at least a second semiconductor chip stacked on the first semiconductor chip, the second semiconductor chip including a first region and a second region and having a bottom surface facing the top surface of the first semiconductor chip;
a first plurality of conductive plugs disposed in the first region of the first semiconductor chip; and
a first plurality of conductive connectors disposed between the first plurality of conductive plugs and the second semiconductor chip to electrically connect the first semiconductor chip with circuitry of the second semiconductor chip,
wherein the first region of the first semiconductor chip corresponds to a respective first region of the second semiconductor chip and the second region of the first semiconductor chip corresponds to a respective second region of the second semiconductor chip,
wherein circuitry of the second region of the second semiconductor chip is electrically connected to the first semiconductor chip only through conductive connectors corresponding to the first region of the first semiconductor chip and the first region of the second semiconductor chip, and
wherein the second region of the second semiconductor chip is warped such that the bottom surface of a second semiconductor chip portion at the first region of the second semiconductor chip between at least two of the conductive connectors is substantially parallel to the top surface of the first semiconductor chip at the first region of the first semiconductor chip, and the bottom surface of a second semiconductor chip portion at the second region of the second semiconductor chip is not substantially parallel to the top surface of the first semiconductor chip at the second region of the first semiconductor chip; and
wherein the circuitry of the second region is not electrically connected to terminals at a bottom surface of the second semiconductor chip in the second region of the second semiconductor chip.

2. The semiconductor package of claim 1, wherein the second region of the second semiconductor chip is warped and wherein none of the circuitry of the second region of the second semiconductor chip is electrically connected to any terminals at a bottom surface of the second semiconductor chip in the second region of the second semiconductor chip.

3. The semiconductor package of claim 1, wherein the second region of the second semiconductor chip comprises a portion of the second semiconductor chip of length in a horizontal direction of at least ⅙ a length in a horizontal direction of the second semiconductor chip.

4. A semiconductor package comprising:
a package substrate;
a first semiconductor chip stacked on the package substrate, the first semiconductor chip including a first region and a second region;
at least a second semiconductor chip stacked on the first semiconductor chip, the second semiconductor chip including a first region and a second region;
a first plurality of conductive plugs disposed in the first region of the first semiconductor chip; and
a first plurality of conductive connectors disposed between the first plurality of conductive plugs and the second semiconductor chip to electrically connect the first semiconductor chip with circuitry of the second semiconductor chip,
wherein the first region of the first semiconductor chip corresponds to a respective first region of the second semiconductor chip and the second region of the first semiconductor chip corresponds to a respective second region of the second semiconductor chip,
wherein circuitry of the second region of the second semiconductor chip is electrically connected to the first semiconductor chip only through conductive connectors corresponding to the first region of the first semiconductor chip and the first region of the second semiconductor chip,
wherein the second region of the second semiconductor chip comprises a portion of the second semiconductor chip in which a bottom surface of the second semiconductor chip maintains a slope of at least 15 degrees compared to a slope of a top surface of the first semiconductor chip; and
wherein at a second semiconductor chip portion between at least two of the conductive connectors, a bottom surface of the second semiconductor chip has substantially no slope compared to a slope of a top surface of the first semiconductor chip.

5. The semiconductor package of claim 1, further comprising:
a first plurality of dummy plugs disposed in the second region of the first semiconductor chip; and
a first plurality of dummy connectors disposed between the plurality of dummy plugs and the second semiconductor chip,
wherein the first semiconductor chip is not electrically connected to circuitry in the first dead zone of the second semiconductor chip via the first plurality of dummy plugs or the first plurality of dummy connectors.

6. The semiconductor package of claim 1, wherein:
the first region of the first semiconductor chip is a region of a first type that includes the first plurality of conductive plugs, which are a first type of conductive plugs;
the second region of the first semiconductor chip is a region of a second type that includes either no conductive plugs or a second type of conductive plugs different from the first type of conductive plugs;
the first semiconductor chip further comprises a third region of the second type, the first region being disposed between the second region and the third region; and
the second semiconductor chip further comprises a third region corresponding to the third region of the first semiconductor chip.

7. The semiconductor package of claim 6, wherein the second type of conductive plugs are dummy plugs, and wherein:
 the second region of the first semiconductor chip and the third region of the first semiconductor chip each include a plurality of dummy plugs;
 a plurality of respective dummy connectors are disposed between the plurality of dummy plugs and the second semiconductor chip at the second and third regions; and
 the first semiconductor chip is not electrically connected to circuitry in the second or third regions of the second semiconductor chip through any of the dummy plugs or dummy connectors.

8. The semiconductor package of claim 4, wherein the second region of the second semiconductor chip is warped and wherein the circuitry of the second region is not electrically connected to terminals at a bottom surface of the second semiconductor chip in the second region of the second semiconductor chip.

9. The semiconductor package of claim 4, wherein the second region of the second semiconductor chip comprises a portion of the second semiconductor chip of length in a horizontal direction of at least ⅙ a length in a horizontal direction of the second semiconductor chip.

10. The semiconductor package of claim 4, further comprising:
 a first plurality of dummy plugs disposed in the second region of the first semiconductor chip; and
 a first plurality of dummy connectors disposed between the plurality of dummy plugs and the second semiconductor chip,
 wherein the first semiconductor chip is not electrically connected to circuitry in the first dead zone of the second semiconductor chip via the first plurality of dummy plugs or the first plurality of dummy connectors.

11. The semiconductor package of claim 4, wherein:
 the first region of the first semiconductor chip is a region of a first type that includes the first plurality of conductive plugs, which are a first type of conductive plugs;
 the second region of the first semiconductor chip is a region of a second type that includes either no conductive plugs or a second type of conductive plugs different from the first type of conductive plugs;
 the first semiconductor chip further comprises a third region of the second type, the first region being disposed between the second region and the third region; and
 the second semiconductor chip further comprises a third region corresponding to the third region of the first semiconductor chip.

12. The semiconductor package of claim 11, wherein the second type of conductive plugs are dummy plugs, and wherein:
 the second region of the first semiconductor chip and the third region of the first semiconductor chip each include a plurality of dummy plugs;
 a plurality of respective dummy connectors are disposed between the plurality of dummy plugs and the second semiconductor chip at the second and third regions; and
 the first semiconductor chip is not electrically connected to circuitry in the second or third regions of the second semiconductor chip through any of the dummy plugs or dummy connectors.

13. A semiconductor package comprising:
 a package substrate;
 a first semiconductor chip stacked on the package substrate, the first semiconductor chip including a first region and a second region;
 at least a second semiconductor chip stacked on the first semiconductor chip, the second semiconductor chip including a first region and a second region;
 a first plurality of conductive plugs disposed in the first region of the first semiconductor chip; and
 a first plurality of conductive connectors disposed between the first plurality of conductive plugs and the second semiconductor chip to electrically connect the first semiconductor chip with circuitry of the second semiconductor chip,
 wherein the first region of the first semiconductor chip is vertically aligned with a respective first region of the second semiconductor chip and the second region of the first semiconductor chip is vertically aligned with a respective second region of the second semiconductor chip,
 wherein circuitry at the second region of the second semiconductor chip is electrically connected to the first semiconductor chip only through conductive connectors corresponding to the first region of the first semiconductor chip and the first region of the second semiconductor chip,
 wherein the second region of the second semiconductor chip is warped such that at least a portion of a bottom surface of the second semiconductor chip maintains a slope of at least 15 degrees compared to a slope of a top surface of the first semiconductor chip; and
 wherein the first region of second semiconductor chip is not warped.

14. The semiconductor package of claim 13, wherein the circuitry of the second region is not electrically connected to terminals at a bottom surface of the second semiconductor chip in the second region of the second semiconductor chip.

* * * * *